United States Patent [19]

Wang

[11] Patent Number: 5,304,281
[45] Date of Patent: Apr. 19, 1994

[54] LASER DEPOSITION OF CUBIC CADMIUM SULFIDE FILMS

[75] Inventor: Xingwu Wang, Alfred, N.Y.

[73] Assignee: Alfred University, Alfred, N.Y.

[21] Appl. No.: 965,217

[22] Filed: Oct. 23, 1992

[51] Int. Cl.$^5$ .............................................. C30B 30/00
[52] U.S. Cl. ............................ 156/614; 156/DIG. 80; 427/586; 148/DIG. 64
[58] Field of Search ............... 156/613, 614, DIG. 80, 156/DIG. 88, DIG. 92; 437/16, 19, 935, 970

[56] References Cited

U.S. PATENT DOCUMENTS 4,059,461 11/1977 Fan et al. ............................. 148/1.5

OTHER PUBLICATIONS

"Effect of laser-irradiation on structural and electrical properties of CdS thin films"; Dawar et al.; *Journal of Applied Physics*; 67(10), pp. 6214–6219 (May 1990).
"Raman investigations of the surface modes of the crystallites in CdS thin films grown by pulsed laser and thermal evaporation", Chuu et al.; *Journal of Applied Physics*; 69(12); pp. 8402–8404 (Jun. 1991).

*Primary Examiner*—Olik Chaudhuri
*Assistant Examiner*—Felisa Garrett
*Attorney, Agent, or Firm*—Howard J. Greenwald

[57] ABSTRACT

A process for preparing a film consisting of at least about 90 weight percent of cubic cadmium sulfide is disclosed.

In one step of this process, a cadmium sulfide target with a density of at least about 3.8 grams per cubic centimeter is provided. In a separate step, there is provided a heated substrate which is at a temperature of from about 50 to about 300 degrees Centigrade. The heated substrate is disposed at a distance of from about 2 to about 10 centimeters from the target.

Both the heated substrate and the target are subjected to a pressure of from about $10^{-4}$ to about $10^{-9}$ Torr. Thereafter, the cadmium sulfide target is contacted with a laser beam with a wavelength of from about 100 nanometers to about 30 microns, an energy of at least about 1.0 watt, and a beam width of less than about 5 millimeters.

18 Claims, 2 Drawing Sheets

LASER DEPOSITION OF CUBIC CADMIUM SULFIDE FILMS

FIELD OF THE INVENTION

A process for preparing a film containing cubic cadmium sulfide. In this process, a solid cadmium sulfide target is bombarded with laser energy, and the material ablated from the surface of the target is deposited onto a substrate maintained at a temperature of from about 50 to about 300 degrees Centigrade.

BACKGROUND OF THE INVENTION

Cadmium sulfide (CdS) is a well known semiconductor with a band gap in the visible region of the spectrum. Films consisting essentially of cadmium sulfide are of use as photoconductors, piezoelectric transducers, and laser materials; and cadmium sulfide has been considered for use in nonlinear optical processing. See, e.g., an article by H. S. Kwok et al. entitled "Growth of highly oriented CdS thin films by laser evaporation deposition," appearing in Applied Physics Letters, Volume 52, No. 13, 28 March 1988.

In the Kwok et al. article, a process is disclosed in which epitaxial growth of a cadmium sulfide film upon a substrate was caused to occur by bombarding a cadmium sulfide target an argon fluoride laser. The process was conducted in a vacuum chamber with a base pressure of $10^{-5}$ Torr. An argon fluoride laser with a wavelength of 193 nanometers operating at 10 pulses per second was focused onto the cadmium sulfide target at a 45 degree angle of incidence, and the cadmium sulfide target was rotated slowly. The substrate was heated to a temperature of either 350 or 400 degrees Centigrade, and it was located about 3 centimeters above the target.

The process of the Kwok et al. article was successful in producing a structure coated with a hexagonal (greenockite) cadmium sulfide film. However, when an attempt was made to produce a structure coated with a cubic (hawleyite, zinc blende) cadmium sulfide film, such attempt was unsuccessful; see, e.g., page 1096 of the article.

There is evidence that the energy band gap for cubic cadmium sulfide is lower than the energy band gap for hexagonal cadmium sulfide. Thus, e.g., in an article by M. Huang et al., appearing in the Journal of Physical Chemistry Solids (Volume 46, No. 8, pages 977-995, 1985), it is disclosed that the energy band gap for the cubic cadmium sulfide is 2.51 electron volts, whereas the energy band gap for the hexagonal cadmium sulfide is 2.56 volts. Reference also may be had to an article by E. L. Lind et al. entitled "Photoconductivity in Cubic Cadmium Sulfide," appearing in the Journal of Chemical Physics, Volume 37, pages 2449-2450 (1962).

As is known to those skilled in the art, the energy band gap is the amount of energy required to cause an electron in a semiconductive material to jump from the valence band to the conductive band; see, e.g., pages 1112-1120 of R. G. Lerner et al.'s "Encyclopedia of Physics," Second Edition (VCH Publishers, Inc., New York, 1991). Thus, for example, substantially less energy is required to activate a cubic cadmium sulfide material than a hexagonal cadmium sulfide material; and this property is advantageous for optoelectronic devices.

It is an object of this invention to provide an economical process for producing a film containing a major amount of cubic cadmium sulfide.

It is yet another object of this invention to provide a process for producing a cubic cadmium sulfide film with excellent optical quality and homogeneity.

It is another object of this invention to provide a process for preparing a single crystal cubic cadmium sulfide thin film material.

It is yet another object of this invention to provide an optical device comprised of a single crystal cubic cadmium sulfide thin film material.

SUMMARY OF THE INVENTION

In accordance with this invention, there is provided a process for preparing a film containing cubic cadmium sulfide. In this process, a solid cadmium sulfide target is bombarded with laser energy, and the material ablated from the surface of the target is deposited onto a substrate maintained at a temperature of from about 50 to about 300 degrees Centigrade.

BRIEF SUMMARY OF THE DRAWINGS

The present invention will be more fully understood by reference to the following detailed description thereof, when read in conjunction with the attached drawings, wherein like reference numerals refer to like elements, and wherein.

DESCRIPTION OF THE PREFERRED EMBODIMENTS

Figure 1:
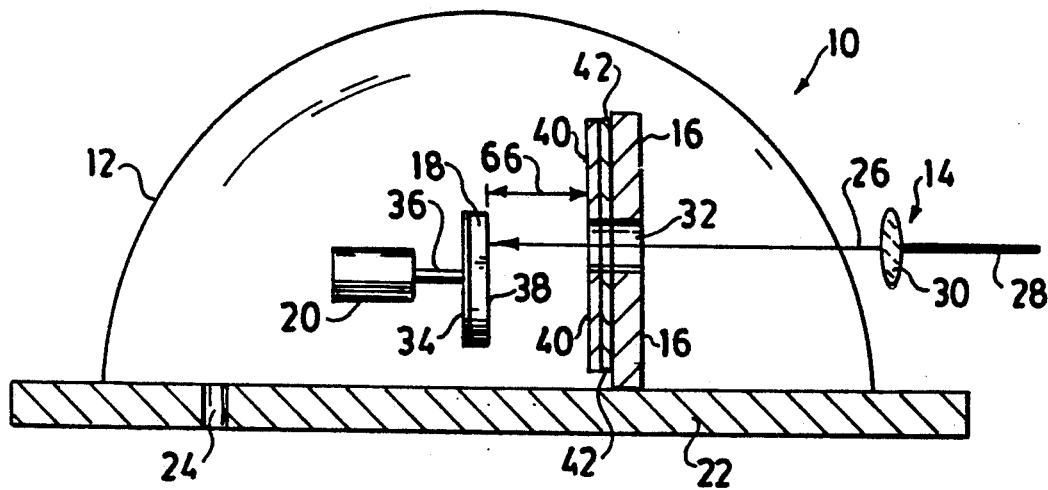
FIG. 1 is schematic of one preferred process for producing the cubic cadmium sulfide film of the invention.

FIG. 1 illustrates one preferred process for producing a cadmium sulfide film. Referring to FIG. 1, it will be seen that reactor 10 is comprised of a vacuum chamber 12, a means for producing a laser beam 14, a substrate holder 16, a target 18, a means 20 for rotating the target 18, and a base 22.

Referring again to FIG. 1, it will be seen that the process depicted in FIG. 1 is preferably conducted under a vacuum of at least about $10^{-4}$ Torr. It is preferred to use a vacuum of from about $10^{-4}$ to about $10^{-9}$ Torr. In one especially preferred embodiment, the vacuum used is from about $10^{-5}$ to about $10^{-6}$ Torr.

Any conventional means may be used for imposing the vacuum upon the system. Thus, by way of illustration and not limitation, and referring to FIG. 1, one may use a vacuum chamber 12 supported on vacuum base 22. The vacuum base 22 is comprised of an orifice 24 which may be connected to conventional means (not shown) for imposing vacuum (such as, e.g., a mechanical pump connected to a diffusion pump). Thus, for example, one may use an Edwards Pirani Penning vacuum system, model 1005, manufactured by the Edwards High Vacuum Inc. of 3279 Grand Island Boulevard, Grand Island, N.Y. 14072. Other conventional means for imposing vacuum may be used; thus, e.g., one may use a turbo-molecular pump.

The vacuum chamber 12 is preferably a bell jar. The vacuum chamber 12 is preferably equipped with a means for transmitting a laser beam 26.

In one embodiment, vacuum chamber 12 is a pyrolytic glass jar which is furnished as part of the aforementioned Edwards vacuum system. This glass jar is an integral structure which, because it transmits laser beams through its surface, need not contain a laser window. In another embodiment, not shown, the vacuum chamber 12 consists essentially of stainless steel; in this embodiment, a quartz window is provided in the chamber 12 for the transmission of the laser beam 26.

Other means for providing the required vacuum to the system and for allowing the transmission of the laser beam also may be used.

In applicant's process, a laser beam with a specified wavelength, beam width, and energy is provided. It is preferred that the laser beam have a wavelength of from about 100 nanometers to about 30 microns and, preferably, have a wavelength of from about 190 nanometers to about 11 microns.

As is known to those skilled in the art, the energy of a laser beam is dependent upon the number of photons which are present in the beam and may be measured, e.g., by conventional photometers. Thus, for example, one may the photometers described on pages 541–544 of "The Photonics Buyers, Guide," 37th Edition (Laurin Publishing Company, Inc., Berkshire Common, Pittsfield, Mass., 1991). It is preferred that the laser beam have an energy of at least about 1.0 watt and, preferably, have an energy of at least about 10 watts. In one embodiment, the laser beam has an energy of from about 10 to about 300 watts.

Any means for providing a laser beam with the desired properties may be used. Thus, by way of illustration and not limitation, one may be use the "Basic Series 255 Laser" which is sold by Holobeam, Inc. of 560 Winters Avenue, Paramus, N.J. 07652. This laser system is a Nd:YAG (neodymium: yttrium/aluminum garnet) laser whose operation is described in a Holobeam, Inc. manual entitled "Holobeam's Basic Series 255 Laser: Operating Instruction Manual" (1972). In a 1.06 micron (1,064 nanometer) neodymium YAG laser, the active atoms are also impurities in a crystal lattice ($Nd^{+3}$ atoms in $Y_3Al_5O_{12}$. See, e.g., pages 308-14 310 of P. W. Milonni et al.'s "Lasers" (John Wiley and Sons, New York, 1988).

In one preferred embodiment, one may use an "excimer" laser. As is known to those skilled in the art, there are some molecules that can exist only in excited electron states, the ground level being dissociative. A molecule of this type is called an excimer, and excimer lasers are based upon such molecules. See, e.g., pages 443–445 of the aforementioned Milonni et al. book. These excimer lasers are commercially available and some of the companies selling them are described, e.g., on page 398 of said "The Photonics Buyers Guide."

Referring again to FIG. 1, it will be seen that laser beam 28 is provided by a suitable source (not shown). Thereafter, the beam width and the location of the laser beam may be adjusted by suitable means such as, e.g., adjustable lens 30.

It is preferred to so adjust lens 30 that the width of the focused laser beam 26 is less than about 5 millimeters. It is more preferred that the width of focused laser beam 26 be less than about 3 millimeters.

Figure 2:
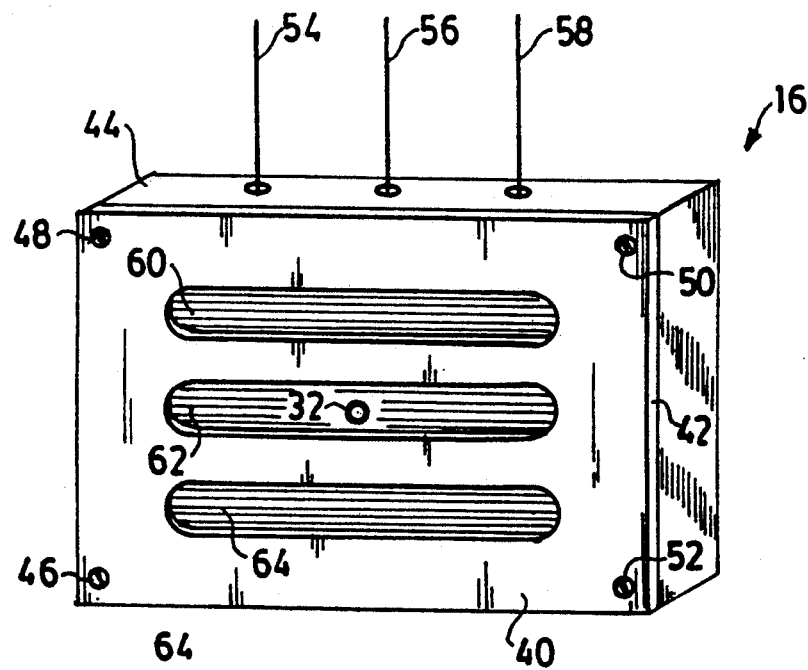
FIG. 2 is a perspective view of the substrate holder used in the process of FIG. 1.

The focused laser beam 26 is passed through a beam opening 32 in substrate holder 16 (which is illustrated in FIG. 2 and described in detail elsewhere in this specification). The focused laser beam then impinges upon target 18.

The target 18 preferably consists of pure or substantially pure cadmium sulfide. It is preferred that the cadmium sulfide in target 18 be at least 95 percent pure. It is more preferred that the cadmium sulfide be at least about 98 percent pure. In one embodiment, the cadmium sulfide is at least about 99 percent pure.

The cadmium sulfide target 18 is preferably made by compacting cadmium sulfide powder into the shape of the target. By way of illustration and not limitation, suitable cadmium sulfide powders which may be used to make the target 18 include the powders available as catalog numbers 21,792-1 and 20,818-3, which are available from the Aldrich Company of 1001 West Saint Paul Avenue, Milwaukee, Wis. By way of further illustration, one may use the cadmium sulfide powder described as catalog number 11058 in the 1992-1993 AESAR catalog (available form AESAR/Johnson Matthey, P.O. Box 8247, Ward Hill, Mass. 01835).

It is preferred that the target 18 have a density of at least about 3.8 grams per cubic centimeter. The target 18 may be of any shape (such as square, circular, triangular, rectangular, or irregular shape), but it is preferably has a circular shape.

Target 18 may be made by conventional forming means from the cadmium sulfide powder. Thus, by way of illustration and not limitation, one may press the cadmium sulfide powder in a 2.54 centimeter diameter die with a height of at least about 0.5 centimeters; it is preferred to use a pressure of at least 50 MegaPascals and, preferably, at least about 80 MegaPascals. The compacted green body then may be sintered at a temperature of from about 200 to about 900 degrees Centigrade for from about 10 minutes to about 5.0 hours until a sintered body with the desired density is obtained. In one embodiment, the green body is sintered at about 300 degrees Centigrade for about 3.0 hours.

The sintered target 18 may then be attached to a target holder 34 which, in turn, may be attached to the shaft 36 of motor 20. One may use conventional means for attaching target 18 to target holder 34; thus, for example, one may use adhesive means. Thus, e.g., one may use mechanical attachment means such as, e.g., a clamp.

By way of illustration and not limitation, one may use an epoxy resin adhesive such as, e.g., those described on pages 434–445 of I. Skeist's "Handbook of Adhesives," Second Edition (Van Nostrand Reinhold Company, New York, 1977).

Referring again to FIG. 1, it is preferred to rotate target 18 at a speed of from about 1 to about 10 revolutions per minute; in one embodiment, from about 2 to about 4 revolutions per minute is used. Alternatively, or additionally, the position of focused beam 26 may be intermittently or continuously moved.

Any conventional means for rotating target 18 may be used, such as, e.g., electric motor 20.

Ablated material from the surface 38 of target 18 is ejected towards mask 40 of substrate holder 16. Substrate 42 is enclosed between substrate holder 16 and mask 40, and the ablated material travels through mask 40 to deposit upon substrate 42.

Any material may be used as substrate 42 which has properties consistent with the desired end use. Thus, by way of illustration and not limitation, one may use glass slides, gallium arsenide, magnesium oxide, zirconium oxide, aluminum oxide, quartz, and the like. In general, it is preferred that substrate 42 consist essentially of an inorganic material and that it be substantially flat and provide a smooth surface. Suitable substrates which may be used in the process are disclosed, e.g., on pages 267–268 of J. D. Doss, "Engineer's Guide to High-Temperature Superconductivity" (John Wiley & Sons, New York, 1989).

By way of illustration, one may use substrates purchased form Laser Diode, Inc. of 205 Forrest Street, Metuchen, N.J. Thus, e.g., one may use the single crystal gallenium arsenide substrates sold by such company. Thus, e.g., one may use Corning glass 7059 as a substrate. Thus, e.g., one may use the magnesium oxide single crystal substrates sold by the Canadian Substrate Supplies Limited of 3052 Saint Andrew Avenue, Niagara Falls, Ontario.

It is preferred that substrate 42 have a thickness greater than about 1.0 micron and, preferably, be at least about 1.5 microns thick.

The substrate 42 is preferably maintained at a temperature of from 50 to about 300 degrees Centigrade during the process. Any conventional means, such as the means illustrated in FIG. 2, may be used to maintain the substrate at such temperature.

FIG. 2 illustrates one preferred substrate holder which may be used in the apparatus of FIG. 1. Referring to FIG. 2, it will be seen that substrate holder 16 comprised of a heater block 44 and mask 40, between which is sandwiched substrate 42. Means for securing the mask 40 to the heater block 44, such as screws 46, 48, 50, and 52, are also provided.

In the embodiment illustrated in FIG. 2, heater block 44 is preferably comprised of, or consists essentially of, a material with a relatively high thermal conductivity, such as, e.g., steel, copper, oxygen-free copper, silver, brass, aluminum, and the like. In one preferred embodiment, heater block 44 consists essentially of copper.

Heater block 44 is preferably comprised of a multiplicity of heaters, such as heater cartridges 54, 56, and 58. In the embodiment illustrated, each of heater cartridges 54, 56, and 58 are electrically connected to a source of electrical power (not shown) by suitable wires (not shown).

As will be apparent to those skilled in the art, other means of heating substrate 42 to a temperature of from about 50 to about 300 degrees Centigrade also may be used.

In one embodiment, prior to the time substrate 42 is attached to the substrate holder 16, it preferably is cleaned to remove contaminants.

In one illustrative embodiment, the substrate 42 is cleaned by rinsing it with deionized water. Thereafter, substrate 42 may be rinsed with a dilute ethanol solution and/or cleaned in an ultrasonic cleaner. The cleaned substrate is then allowed to dry.

The cleaned substrate 42 is sandwiched between the heater block 44 and the mask 40. Mask 40, which is comprised of a multiplicity of openings 60, 62, and 64, may consist or be comprised of a metallic material such as nickel, chromium, steel, stainless steel, or any other high-melting point metal. In the embodiment illustrated in FIG. 2, mask 40 preferably consists of stainless steel.

In the embodiment illustrated in FIG. 2, the ablated material from target 18 may be deposited through openings 60, 62, and 64 onto selected, exposed portions of substrate 42.

Referring to FIG. 1, it is preferred to operate the process depicted therein so that the film is deposited onto substrate 42 at a rate of at least about one micron (in film thickness) per hour. It is preferred to deposit at least about 2.0 microns per hour of film upon the substrate 42. As will be apparent to those skilled in the art, the deposition rate will vary with the energy of the laser beam used, its wavelength, its beam width, and the density of the target.

It is preferred that exterior surface 38 of target 18 be at a distance 66 from the surface of mask 40 of from about 2 to about 10 centimeters and, more preferably, from about 4 to about 6 centimeters (see FIG. 1).

Referring again to FIG. 1, it will be apparent to those skilled in the art that different types of laser beams may be used in the process.

In one embodiment, the laser (not shown) is operated as a continuous wave.

In another embodiment, the laser (not shown) is operated in a pulsed mode, intermittently sending out pulses of energy. As is known to those skilled in the art, this is commonly referred to as "Q switching" and is described, e.g., on pages 373–375 of the aforementioned Milonni et al. book. In this embodiment, it is preferred to generate from about 5 to about 20 discrete pulses per second.

In another embodiment, the laser (not shown) is operated at is fundamental wave length. Alternatively, or additionally, the laser may operated at its second harmonic frequency (see pages 629 and 632–642 of said Milonni et al. book).

By way of illustration, a second harmonic generator is used with the Nd:YAG laser with a wave length 1.064 microns; because the second harmonic generator is used, the effective wavelength is 532 nanometers.

Figure 3:
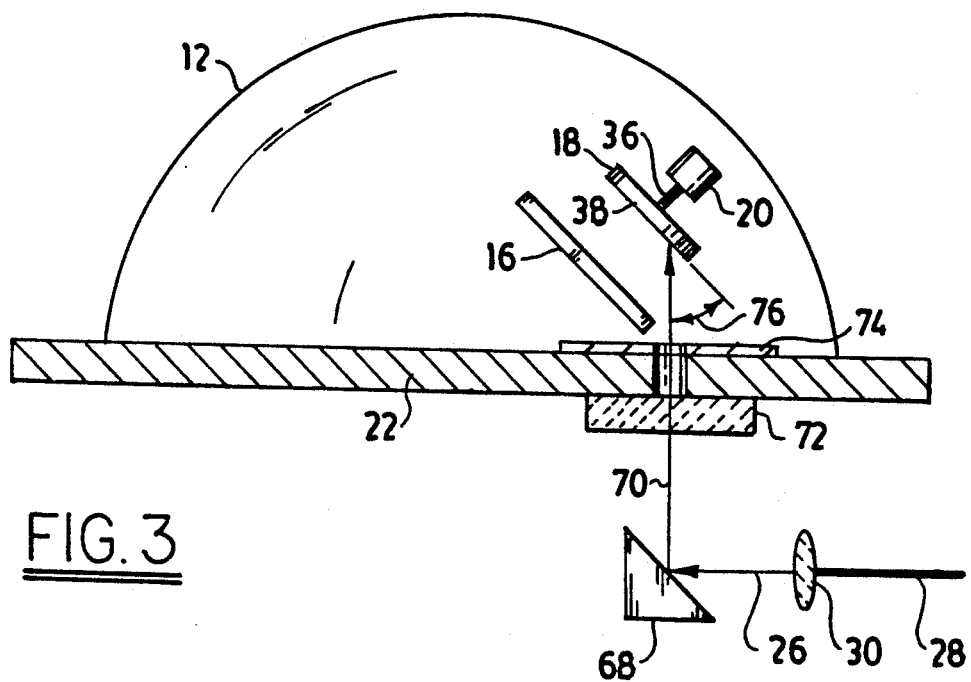
FIG. 3 is a schematic of another preferred process for producing the cubic cadmium sulfide film.

FIG. 3 illustrates another preferred embodiment of applicant's process. Referring to FIG. 3, the source of the laser beam (not shown) produces laser beam 28 which is focused by adjustable lens 30 and is caused to impinge upon prism 68 to cause the reflected laser beam to pass through quartz window 72 and shield 74 and to contact target 18. The substrate holder 16 may be similar to the one depicted in FIGS. 1 and 2.

Referring again to FIG. 3, and in the embodiment depicted therein, the angle of incidence 76 formed by reflected laser beam 70 and the exterior surface 38 of target 18 is, in this embodiment, less than 90 degrees and, preferably, is from about 15 to about 85 degrees.

Figure 4:
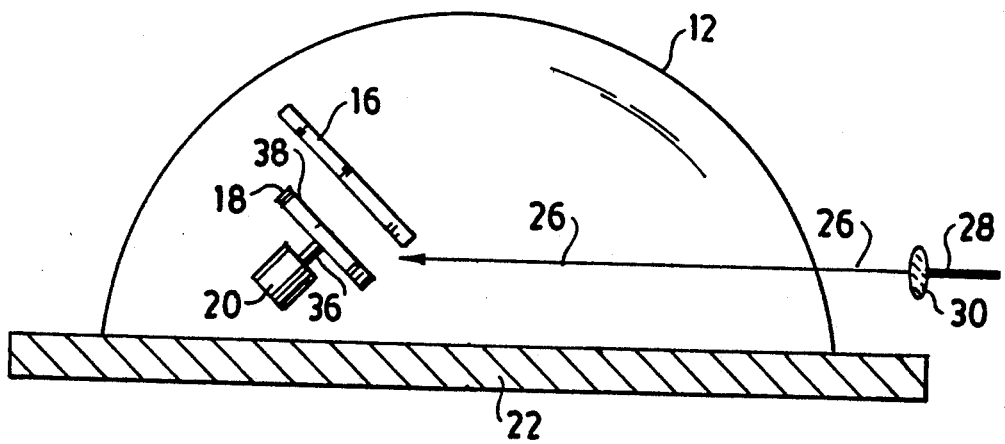
FIG. 4 is a schematic of yet another process for producing cubic cadmium sulfide film.

FIG. 4 illustrates another embodiment in which the angle of incidence is formed by the laser beam 26 and the surface 38 of the target 18 is also less than about 90 degrees. As will be apparent to those skilled in the art, some of the features of the devices of FIGS. 3 and 4 such as, e.g., the openings 24 of FIG. 1, have been omitted for the purposes of clarity and ease of illustration.

The following examples are presented to illustrate the claimed invention but are not to be deemed limitative thereof. Unless otherwise specified, all parts are by weight, and all temperatures are in degrees Centigrade.

Example 1: Preparation of a cadmium sulfide target 10.0 grams of a cadmium sulfide powder with an average particle size less than about 5.0 microns was obtained as reagent 21,792-1 from the Aldrich Chemical Company. The powder was ground in a mortar and pestle until all of its particles to insure that substantially all of its particles were smaller than about 5.0 microns.

The ground powder was then charged to a stainless steel die with an inner diameter of 2.54 centimeters and a 5.0 centimeters. This powder so charged was subjected to a pressure of 90 MegaPascals with a bench press until a green body with a thickness of about 0.5 centimeters was formed.

The green body was then charged to a preheated box furnace at a temperature of 300 degrees Centigrade, and it was subjected to such temperature for 3.0 hours.

Example 2: preparation of film

Utilizing the device depicted in FIG. 1, the sintered target from Example 1 was glued onto the target holder 34. The vacuum chamber 12 was evacuated with the Edwards Pirani Penning model 1005 vacuum system until a pressure of $10^{-7}$ Torr existed within the vacuum chamber.

A glass substrate, which was about 2.0 centimeters wide, 5.0 centimeters long, and 2 millimeters thick (Corning glass 7059, Corning, Inc., Corning, New York) was placed within the substrate holder of FIG. 2). The substrate was heated to a temperature of 200 degrees Centigrade.

The target was caused to rotate at a speed of 2.0 revolutions per minute. A source of a continuous wave of laser light was produced by the Holobeam's Basic Series 255 Nd:YAG laser; it had a power of about 10 watts, and a wave length of 1.064 microns.

The laser beam was caused to impinge upon the target for 30 minutes, causing deposition of a film of ablated material which was about 1.0 micron thick. During this deposition, because of the ablation of the surface of the target material, the pressure within chamber 12 increased to about $10^{-6}$ Torr.

Example 3: evaluation of the CdS film

The cadmium sulfide deposition on the glass substrate which was produced in the experiment of Example 2 was then studied by X-ray diffraction analysis on a Siemens D-500 Diffractometer (model number C722298-A223-B-9-POZ-228, manufactured by the Siemens Company of Germany) using copper K-alpha radiation and a diffracted beam graphite monochrometer. Analysis revealed that A.S.T.M. phase 10-454, "beta cadmium sulfide" (cubic, hawleyite) was dominant; at least about 90 weight percent of the film was the cubic cadmium sulfide.

The film so deposited was also subjected to Energy Dispersive X-ray analysis (EDS). Such analysis revealed that the film had a composition of cadmium and sulfur in a 1:1 mole ratio.

The film so deposited was also subjected to Scanning Electron Microscope (SEM) analysis. This analysis indicated that the film was optically smooth, with a particle size smaller than about 50 nanometers.

The film so deposited was also subjected to ultraviolet and visible spectrum analyses. Such analyses indicated that the absorption edge (corresponding to the energy gap) of the film at room temperature was 515 nanometers.

Comparative example 4: use of higher substrate temperature

In substantial accordance with the procedure of Example 1, a film comprised of hexagonal cadmium sulfide was produced. In procedure of this Example, the substrate was maintained at a temperature of 400 degrees Centigrade.

X-ray analysis of the deposited film indicated a structure consistent with A.S.T.M. 6-0314 (hexagonal cadmium sulfide, greenockite). The absorption edge, at room temperature, of the film of this example was 500 nanometers. Thus, the energy band gap of the film of this Example was substantially larger than the energy band gap of the film of Examples 1-3.

Example 5: use of gallium arsenide substrate

The procedure of Examples 1-3 was substantially followed, with the exception that the substrate used consisted essentially of gallium arsenide. The substrate had a size of from 1.0 centimeter by 1.0 centimeter by 2 millimeters, and it had an single crystal orientation of 100; it was obtained from Laser Diode Inc. of 205 Forrest Street, Metuchen, N.J.

The film produced on this substrate, with a substrate temperature of 200 degrees Centigrade, was also primarily cubic cadmium sulfide. It had absorption edge, at room temperature, of about 500 nanometers. At 10 degrees Kelvin, the absorption edge of this film was 502 nanometers; this phenomenon is in accordance with energy gap theory.

Example 6: use of higher substrate temperature

The procedure of Example 5 was substantially repeated, with the exception that a substrate temperature of 400 degrees Centigrade was used. Analysis indicated a structure consistent with A.S.T.M. 6-0314 (hexagonal cadmium sulfide, greenockite). The absorption edge, at room temperature, of the film of this example was 500 nanometers.

Examples 7-8: use of second harmonic waves

The procedure of Examples 1-3 was substantially repeated with the exception that the wavelength of the laser beam was 532 nanometers. When a substrate temperature of 200 degrees Centigrade was used, the cubic cadmium sulfide film was predominantly produced. When a substrate temperature of 400 degrees Centigrade was used, the hexagonal cadmium sulfide film was predominantly produced.

It is to be understood that the aforementioned description is illustrative only and that changes can be made in the apparatus, in the ingredients and their proportions, and in the sequence of combinations and process steps, as well as in other aspects of the invention discussed herein, without departing from the scope of the invention as defined in the following claims.

I claim:

1. A process for preparing a film consisting of at least about 90 weight percent of cubic cadmium sulfide, comprising the steps of:
    (a) providing a cadmium sulfide target with a density of at least about 3.8 grams per cubic centimeter;
    (b) providing a heated substrate which is at a temperature of from about 50 to about 300 degrees Centigrade;
    (c) disposing said heated substrate at a distance of from about 2 to about 10 centimeters from said cadmium sulfide target;
    (d) subjecting said heated substrate and said target to a pressure of from about $10^{-4}$ to about $10^{-9}$ Torr; and
    (e) contacting said cadmium sulfide target with a continuous wave laser beam with a wavelength of from about 100 nanometers to about 30 microns, an energy of at least about 1.0 watt, and a beam width of less than about 5 millimeters while rotating said target at a rate of from about 1 to about 10 revolutions per minute.

2. The process as recited in claim 1, wherein said heated substrate and said target are subjected to a pressure of from about $10^{-5}$ to about $10^{-6}$ Torr.

3. The process as recited in claim 1, wherein said heated substrate and said target are disposed within a reaction chamber.

4. The process as recited in claim 3, wherein said reaction chamber is comprised of a quartz window.

5. The process as recited in claim 3, wherein said reaction chamber is in a pyrolytic glass jar.

6. The process as recited in claim 1, wherein said laser beam has a wavelength of from about 190 nanometers to about 11 microns.

7. The process as recited in claim 1, wherein said laser beam has an energy of at least about 10 watts.

8. The process as recited in claim 7, wherein said laser beam has an energy of from about 10 to about 300 watts.

9. The process as recited in claim 1, wherein said laser beam is produced by a neodymium:yttrium/aluminum garnet laser.

10. The process as recited in claim 1, wherein said laser beam is produced by an excimer laser.

11. The process as recited in claim 1, wherein the width of said laser beam is less than about 3 millimeters.

12. The process as recited in claim 1, wherein said target has a substantially circular shape.

13. The process as recited in claim 1, wherein said substrate consists essentially of glass.

14. The process as recited in claim 1, wherein said substrate consists essentially of gallium arsenide.

15. The process as recited in claim 1, wherein said heated substrate is at a temperature of from about 150 to about 250 degrees Centigrade.

16. The process as recited in claim 2, wherein:
(a) said heated substrate and said target are disposed within a reaction chamber; and
(b) said laser beam has a wavelength of from about 190 nanometers to about 11 microns, an energy of at least about 10 watts, and a width of said laser beam is less than about 3 millimeters.

17. The process as recited in claim 16, wherein:
(a) while said cadmium sulfide target is being contacted with said laser beam, said target is rotated at a speed of from about 1 to about 10 revolutions per minute; and
(b) said heated substrate is at a temperature of from about 150 to about 250 degrees Centigrade, 18. The process as recited in claim 17, wherein said laser is produced by a neodymium:yttrium/aluminum garnet laser and has a wavelength which is the second harmonic of said laser.

* * * * *